(12) United States Patent
Casiraghi et al.

(10) Patent No.: US 8,884,699 B2
(45) Date of Patent: Nov. 11, 2014

(54) INPUT COMMON MODE CONTROL USING A DEDICATED COMPARATOR FOR SENSOR INTERFACES

(71) Applicant: Maxim Integrated Products, Inc., San Jose, CA (US)

(72) Inventors: Roberto Casiraghi, Milan (IT); Carlo Caminada, Pregnana Milanese (IT); Giorgio Massimiliano Membretti, Milan (IT)

(73) Assignee: Maxim Integrated Products, Inc., San Jose, CA (US)

( * ) Notice: Subject to any disclaimer, the term of this patent is extended or adjusted under 35 U.S.C. 154(b) by 10 days.

(21) Appl. No.: 13/718,705

(22) Filed: Dec. 18, 2012

(65) Prior Publication Data

US 2014/0300415 A1 Oct. 9, 2014

(51) Int. Cl.
*H03F 3/45* (2006.01)

(52) U.S. Cl.
CPC .................................. *H03F 3/45071* (2013.01)

USPC .......................................................... 330/258

(58) Field of Classification Search
CPC ............ H03F 3/45183; H03F 3/45659; H03F 3/45479; H03F 2203/45424; H03F 3/45475; H03F 1/3211; H03F 3/45071; H03F 1/34; H03F 1/083; H03F 3/45085; H03F 2203/45702
USPC .................................................. 330/252–261
See application file for complete search history.

(56) References Cited

U.S. PATENT DOCUMENTS 8,643,924 B2 * 2/2014 Okada ......................... 359/202.1
2007/0163815 A1 * 7/2007 Ungaretti et al. .......... 178/18.06

* cited by examiner

*Primary Examiner* — Hieu Nguyen
(74) *Attorney, Agent, or Firm* — North Weber & Baugh LLP

(57) ABSTRACT

Various embodiments of the invention allow for low-noise, high performance input common mode voltage control in capacitive sensor front end amplifiers. In certain embodiments overcome the shortcomings of the prior art by implementing a full voltage swing common mode voltage comparator in a parallel feed-forward path to compensate large common mode input signal variations.

20 Claims, 6 Drawing Sheets

INPUT COMMON MODE CONTROL USING A DEDICATED COMPARATOR FOR SENSOR INTERFACES

BACKGROUND

A. Technical Field

The present invention relates to common mode controls and to systems, devices, and methods of controlling common mode voltage in capacitive inertial sensor circuits.

B. Background of the Invention

Capacitive sensing circuits are used in gyroscopes, pressure sensors, accelerometers, etc. to sense a change in capacitance value caused by a linear or rotational movement. A differential change can be detected by a differential operational amplifier that outputs a proportional voltage, which then can be converted into the desired physical quantity to be detected, for example, rotation, pressure, or acceleration.

A capacitive sensing circuit operates through a driving signal, like a voltage step, provided to a capacitive sensor and the front end amplifier that reads and amplifies the sensor signal. Typically, a fully differential input charge amplifier is used since fully differential amplifiers are more reliable, accurate, and relatively immune to noise generated by the power supply. However, fully differential charge amplifiers generally require control of the input common mode voltage through a dedicated circuit, which can have a significant negative impact on the amplifier's performance. The fully differential front end charge amplifier and its common mode voltage control for the capacitive inertial sensor are often implemented using switch-capacitor circuits.

Switch-capacitor input common mode voltage control circuits require a relatively a large feedback capacitance that increases the total input front end capacitance and thereby increases system noise and decreases the amplifier's performance. In addition, the inability of the common mode feedback amplifier to quickly and precisely recover the desired common mode voltage reduces the maximum available operation speed of the front end electronics. What is needed are common mode voltage controls that overcome the above-described limitations.

SUMMARY OF THE INVENTION

Various embodiments of the invention provide a low noise approach for input common mode voltage control in capacitive sensor front end electronics. In particular, certain embodiments of the invention allow system integrators to minimize overall amplifier input capacitance and thereby optimize amplifier noise performance.

Certain embodiments of the invention take advantage of a full voltage swing common mode voltage comparator circuit that is configured in parallel to a common mode feedback control circuit to correct for most of the input common mode voltage change caused by the stimulus that drives the capacitive sensor. The comparator circuit acts as a parallel feedforward branch that helps to more rapidly and efficiently compensate common mode input signal variations to optimize overall system performance.

Certain features and advantages of the present invention have been generally described here; however, additional features, advantages, and embodiments are presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention.

In this document the terms "sensor" and "sensing circuit" are used interchangeably.

Figure 1:
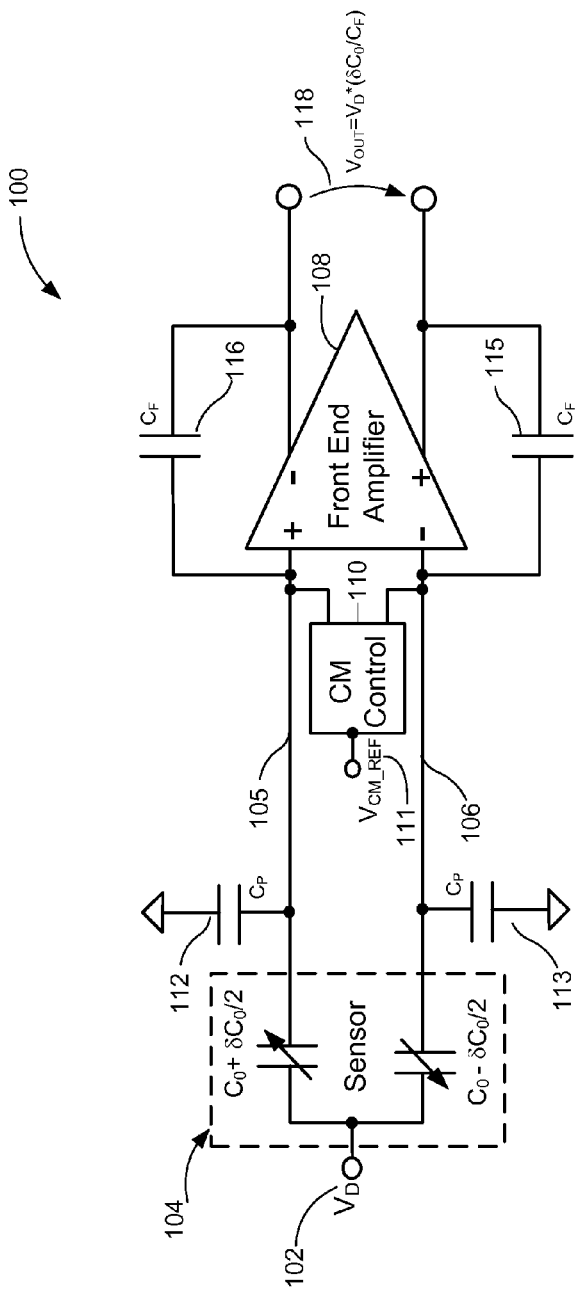
FIG. 1 illustrates a prior art charge amplifier front end circuit for differential capacitive sensors.

FIG. 1 illustrates a prior art charge amplifier front end circuit for differential capacitive sensors. FIG. 1 exemplifies the basic functionality of a fully differential front end charge amplifier 100 commonly used in capacitive sensors applications.

A voltage stimulus, $V_D$, is applied, typically in the form of a pulse function, at terminal 102 of sensor 104. The voltage stimulus generates, at the input of charge amplifier 108, both a differential signal and a common mode signal. The generated common mode signal does not contribute to the desired readout. Variations in the common mode signal constitute undesirable disturbances. In some instances, the common mode voltage may assume such high values as to saturate the input common mode voltage range of charge amplifier 108. Since amplifiers are generally designed to work within their linear range, once charge amplifier 108 is saturated, it can no longer properly function in amplifying the differential signal. Typically, an input common mode feedback control circuit 110 is employed to prevent the common mode voltage level at the input of charge amplifier 108 from changing excessively from the desired $W_{CM\_REF}$ value 111.

In addition, parasitic capacitance $C_P$ 112, 113 exists at input terminal 105, 106 of fully differential charge amplifier 108. Parasitic input capacitance 112, 113 includes both sensor and front end amplifier parasitic capacitances. The effect of parasitic capacitance 112, 113 is to increase the total input capacitance of amplifier 108. Since noise performance of capacitive sensor front end electronics is very sensitive to input capacitance, parasitic capacitance 112 and 113 should be minimized in order to reduce the degradation of noise performance.

The input noise of front end amplifier 108 is amplified at the output 118 by a factor proportional to $(C_P+C_F+C_0)/C_F$, wherein $C_F$ is the capacitance value of feedback capacitor 115, 116. The signal gain, which is defined as the ratio of the output voltage 118 of charge amplifier 108 to the capacitance variation of capacitive sensor 104, is proportional to $\delta C/C_F$. One skilled in the art will recognize that, at the one hand, small capacitance values $C_F$ of feedback capacitor 115, 116 are desirable to achieve increased signal gain but, on the other hand, a small $C_F$ value leads to high parasitic input capacitance 112, 113 that severely impacts noise gain. Therefore, minimizing the total input capacitance of fully differential charge amplifier 108 is crucial to minimizing system noise and increasing overall system performance.

Figure 2:
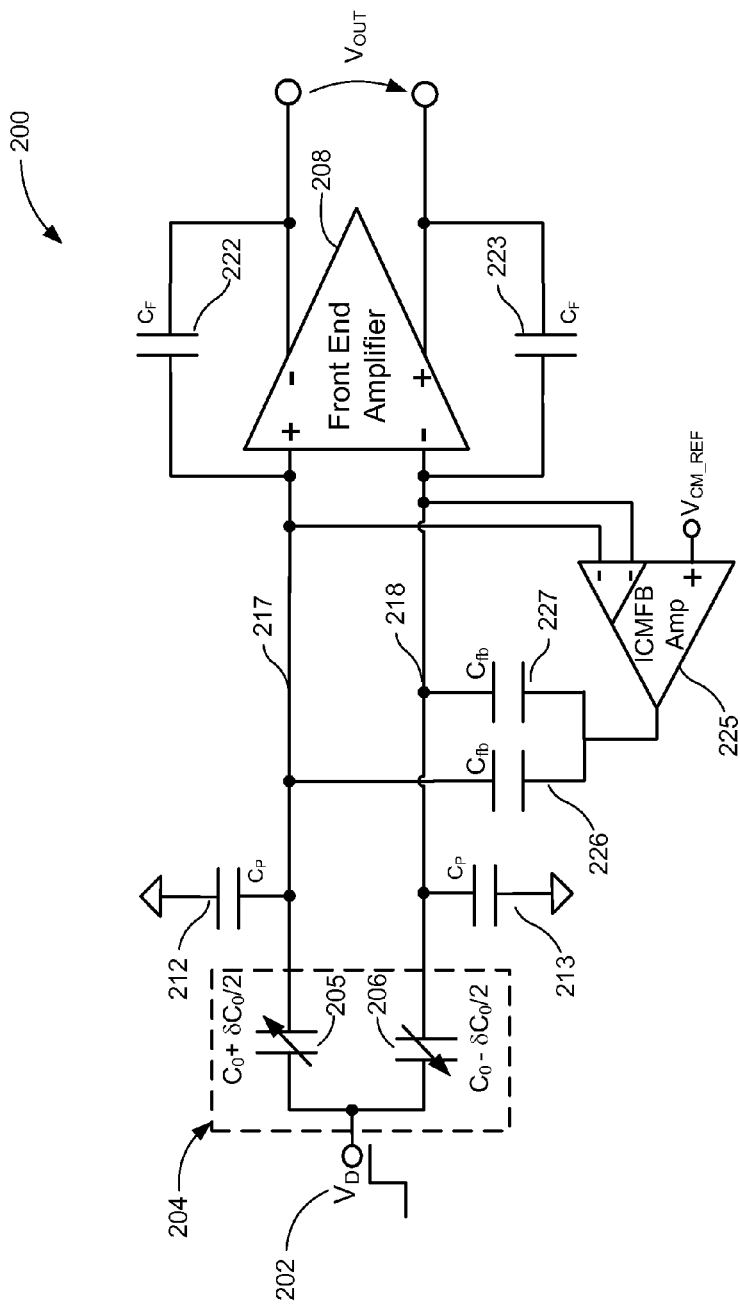
FIG. 2 illustrates a prior art front end electronics architecture of a common mode voltage control using a common mode feedback amplifier.

FIG. 2 illustrates a prior art front end electronics architecture of a common mode voltage control using a common mode feedback amplifier. The topology in front end circuit 200 depicted in FIG. 2 is used in certain sensor applications that require common mode voltage control, such as in a fully differential switched-capacitor amplifier circuit. Differential capacitive sensor 204 receives a driving signal $V_D$ at terminal 202. The stimulus signal is a voltage step function that drives a charge through sense capacitors 205 and 206 changing the common mode voltage at front end amplifier inputs. The charge is equivalent to the amplitude of the voltage of the stimulus signal multiplied by the capacitance of sense capacitor 205, 206. Common mode feedback amplifier 225 must inject charge to compensate for the common mode voltage change at input terminal 217, 218. Ideally, the voltage at input terminal 217, 218 remains constant at all times.

The charge that can be compensated for by common mode feedback amplifier 225 is equal to the dynamic output range of amplifier 225 multiplied by the capacitance value of feedback capacitor 226, 227. The dynamic output range of amplifier 225 is limited to a value less than the power supply voltage. The limitation of the output range of amplifier 225 requires a large capacitance value of feedback capacitor 226, 227 in order to sufficiently compensate for the charge injected by the stimulus signal $V_D$. The minimum capacitance value of feedback capacitor 226, 227 depends on sense capacitor 205, 206 and the voltage $V_D$ applied to terminal 202. Unfortunately, the capacitance of feedback capacitor 226, 227 significantly increase the total input capacitance, which increases the amplified noise and results in a degradation of the noise performance of front end amplifier 208. In contrast, some embodiments of the current invention use a low capacitance input common mode voltage control approach employing a rail-to-rail comparator circuit.

Figure 3:
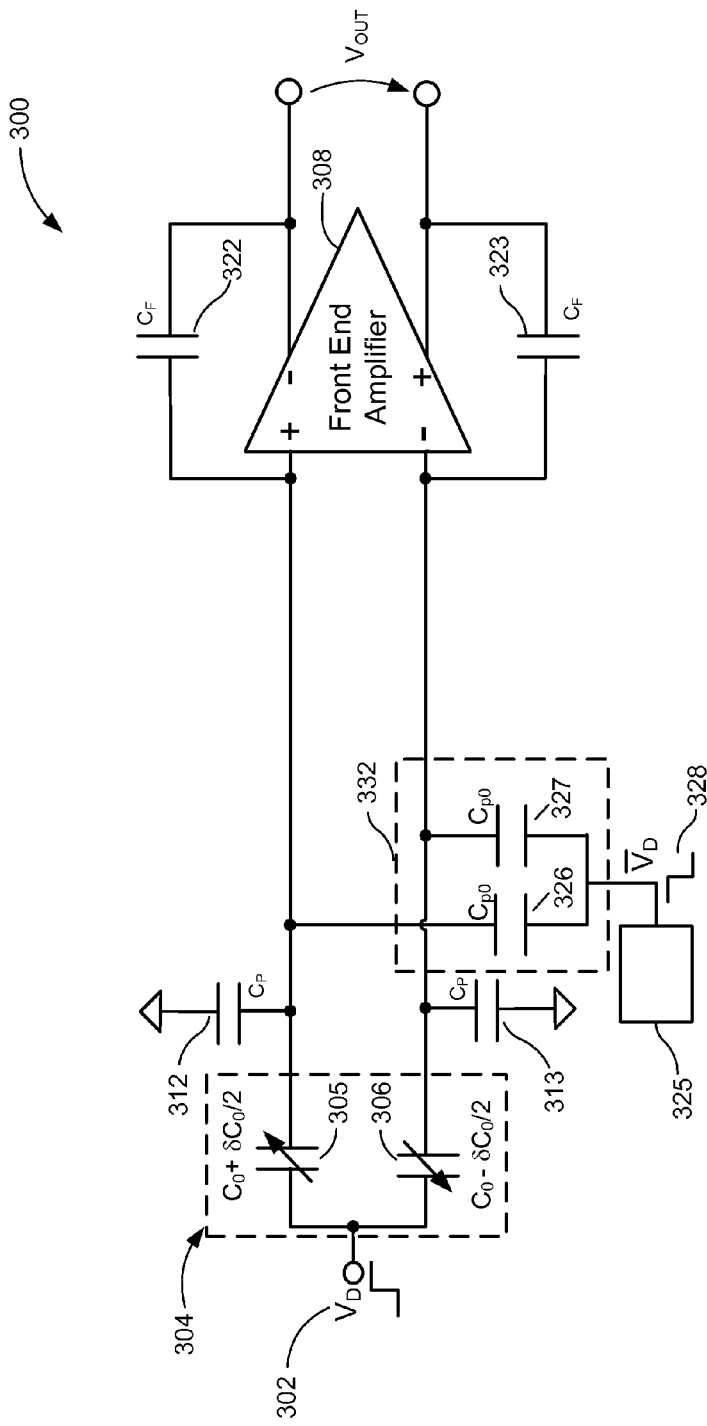
FIG. 3 illustrates a prior art "Wheatstone bridge" input common mode control circuit.

FIG. 3 illustrates another prior art input common mode control circuit. The topology in FIG. 3 is a prior art capacitive "Wheatstone bridge" common mode voltage control circuit having an optional input common mode feedback amplifier. Driving step voltage $\bar{V}_D$ 328 of equal magnitude but opposite polarity with respect to stimulus step voltage $V_D$ 302 that is applied to sensing capacitor 305, 306 is applied to control capacitor $C_{p0}$ 326, 327. Control capacitor $C_{p0a}$ 326, 327 serves as a passive common mode control circuit 332. This topology takes advantage of the properties of the common Wheatstone bridge depicted in FIG. 4. In capacitive Wheatstone bridge common mode voltage control circuit 300, all fixed resistors of the Wheatstone bridge are replaced with fixed control capacitors $C_{p0}$ 326, 327, and all variable resistors of the Wheatstone bridge are replaced with variable capacitor 305, 306 of sensor 304.

Figure 4:
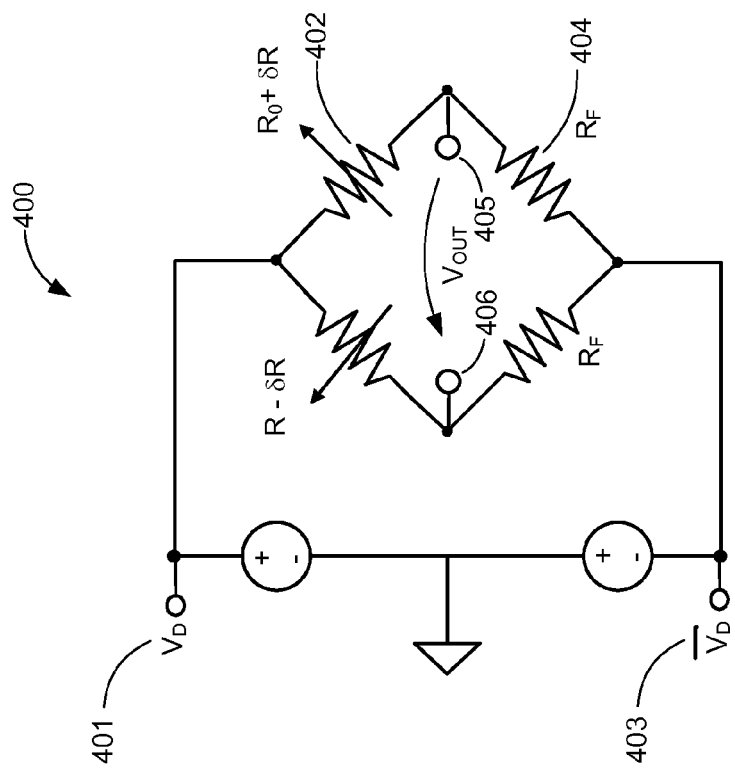
FIG. 4 is a general illustration of a typical "Wheatstone bridge" circuit.

FIG. 4 is a general illustration of a typical "Wheatstone bridge" circuit. In a perfectly compensated configuration, the value of fixed resistor 404 is adjusted to match the value of typical variable resistor $R_0$ 402, such that the output voltage $V_{OUT}$ is a differential output proportional to the amplitude of voltage $V_D$ and the common mode voltage at terminals 405, 406 is set at the desired level.

Returning now to the capacitive Wheatstone bridge topology shown in FIG. 3. This circuit comprises an open loop system that does not sense the input of amplifier 308. Rather, it applies an open loop correction to the differential signal without regard to the voltage variations present at the input of amplifier 308. One problem with this design is that sensing capacitance $C_0$ of sensing capacitor 305, 306 is generally unknown. The capacitance of control capacitor $C_0$ 326, 327 could be designed to match a typical value of sensing capacitance $C_0$.

A further drawback of the capacitive Wheatstone bridge design is timing skew error that is caused when the two step voltages $V_D$ and $\bar{V}_D$ at 302 and 328, respectively, are applied with a timing delay relative to each other. Unavoidable variations in the manufacturing process may result in different delays for the two step voltages. The resulting timing skew error, however short, at the amplifier input must be accounted for and controlled to avoid unwanted excessive input common mode voltage pulse variations. Various embodiments of the present invention overcome the limitation of timing skew control of the capacitive Wheatstone bridge design and other prior art solutions.

Figure 5:
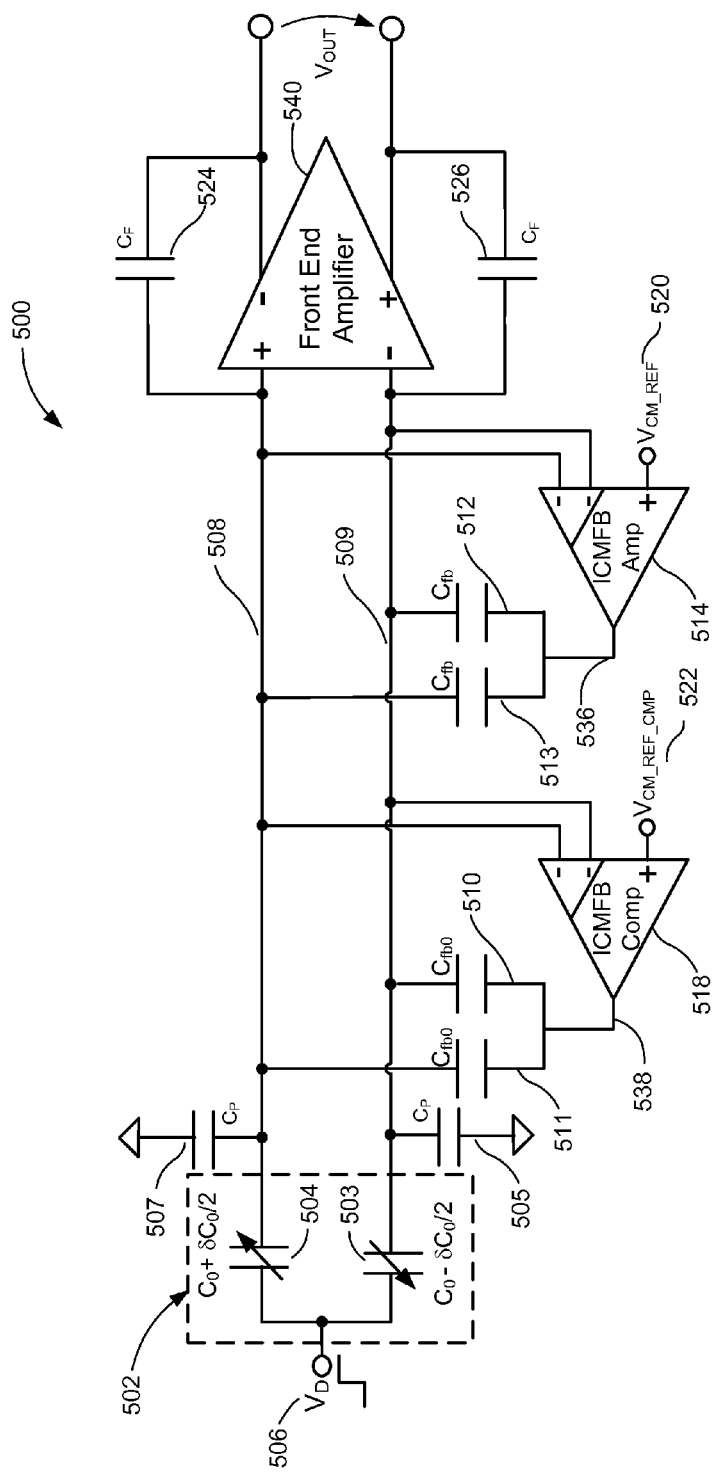
FIG. 5 illustrates a comparator-based common mode voltage control circuit according to various embodiments of the invention.

FIG. 5 illustrates a comparator-based common mode voltage control circuit according to various embodiments of the invention. Fully differential detection circuit 500 is a comparator-based common mode voltage control circuit comprising optional active input common mode feedback (ICMFB) amplifier 514. Detection circuit 500 comprises sensor 502, front end amplifier 540 comprising feedback capacitor 524, 526, input common mode feedback comparator (ICMFBC) 518 comprising feedback capacitor 510, 511, and ICMFB amplifier 514 comprising feedback capacitor 512, 513. The details of ICMFBC 518 are omitted for clarity. Sensor 502 may be any sensor capable of producing a differential output signal.

As shown in FIG. 5, differential capacitive sensor 502 receives driving signal $V_D$ 506. Signal $V_D$ 506 is, for example, a voltage step that is applied to sensor 502 to drive a charge through a pair of sense capacitors 503, 504. The charge is proportional to driving signal $V_D$ 506 multiplied by the variance in capacitance of sense capacitors 503, 504. Sense capacitors 503, 504 measure a differential capacitance that results from a linear or rotational movement of electrodes disposed within sensor 502. The resulting capacitive imbalance of sense capacitors 503, 504 from a reference capacitance that sensor 502 would assume at rest, causes both an increase in the value of capacitor 503 and a decrease of the capacitance of capacitor 504 by an equal amount. Sensor 502 detects the mismatch of sense capacitors 503, 504 as a differential change and, in response thereto, generates a differential output signal. The differential output signal of sensor 502 is received at the input of differential front end amplifier 540.

A first output terminal of sensor 502 couples sense capacitor 503 to non-inverting input terminal 508 of front end amplifier 540. A second output terminal of sensor 502 couples sense capacitor 504 to inverting input terminal 509 of front end amplifier 540. Amplifier 540 receives the differential output signal, e.g., a voltage that is proportional to the capacitive change in sensor 502, and generates output voltage signal 544 from which the desired physical quantity to be detected can be derived. The output of front end amplifier 540 is fed back to the respective input 508, 509 via feedback capacitor 524, 526, which serves as integration capacitor in generating output voltage signal 544. Detection circuit 500 further comprises ICMFB amplifier 514 and full swing ICMFBC 518.

ICMFBC 518 is coupled between sensor 502 and front end amplifier 540 and comprises two differential inputs that are coupled to respective non-inverting and inverting input terminals 508, 509 of amplifier 540. ICMFBC 518 further comprises a reference input terminal coupled to receive reference voltage 522. Feedback voltage 538 of ICMFBC 518 is coupled to input terminals 508, 509 of front end amplifier 540 via feedback capacitors 510, 511. Feedback capacitors 510, 511 share a common terminal that is coupled to feedback voltage 538 at the output of ICMFBC 518.

The precise value of feedback capacitor 510, 511 of ICMFBC 518 may be difficult to determine due to variations of sensor 502, for example, during the manufacturing process. In one embodiment, optional ICMFB amplifier 514 is used to precisely control the input common mode voltage. ICMFB amplifier 514 is an active circuit that is coupled, in a first loop configuration, between sensor 502 and front end amplifier 540. Amplifier 514 comprises two differential inputs that are coupled to non-inverting and inverting input terminals 508, 509 of amplifier 540, respectively, and a reference input terminal coupled to reference potential 520. Feedback voltage 536 of amplifier 514 is coupled to the input terminals of front end amplifier 540 via feedback capacitor 512, 513. Feedback capacitors 512, 513 share a common terminal with each other, the common terminal being coupled to feedback voltage 536 at the output of ICMFB amplifier 514. Amplifier 514 detects a voltage difference between non-inverting and inverting input terminals 508, 509 of front end amplifier 540 and outputs feedback voltage 536 to compensate the common mode voltage variation not perfectly recovered by ICMFBC 518.

In one embodiment, comparator 518 is a full swing comparator that serves as a feed-forward branch for ICMFB amplifier 514. ICMFBC 518 may be implemented as a dedicated rail-to-rail comparator that utilizes the entire power supply range to compensate for the input common mode change thereby providing for a fast recovery. Comparator 518 compares the common mode voltage of non-inverting and inverting input terminals 508, 509 of amplifier 540 with reference voltage 522. Once the input common mode voltage difference from the desired level exceeds a predetermined threshold value, ICMFBC 518 quickly reacts by delivering a charge that is fed back to the input of amplifier 540 to compensate for the common mode input variation. For example, ICMFBC 518 may be designed to apply a correction signal to the common mode signal when the input common mode voltage variation threshold exceeds 10 mV to bring the variation below the threshold of the comparator. ICMFBC 518 is relatively faster than ICMFB amplifier 514. Additionally, since ICMFBC 518 utilizes the rail-to-rail output dynamic range, it can recover the common mode voltage signal that it detects at the inputs of front end amplifier 540 relatively faster due to the lower input capacitance when compared to prior art designs.

Further, when ICMFB amplifier 514 is used to precisely control the input common mode level variations, it needs to generate a reduced amount of charge to overcome the common mode voltage variations than without comparator 518. This allows for a reduction in common mode feedback capacitors 512, 513 when compared with prior art designs.

Another benefit is that the addition of ICMFBC 518 allows amplifier 514 to have a lower bandwidth than prior art designs. Yet another benefit of adding ICMFBC 518 is that, unlike in the Wheatstone bridge topology of FIG. 3 discussed above, no accurate of control the timing skew between the signal applied to the sensor and the additional signal of opposite polarity applied to the bridge capacitors is required. This significantly simplifies the re-design and tuning of sensor 502 since timing skew errors do not affect the threshold voltage and, therefore, do not have to be taken into consideration. Instead, detection circuit 500 can be designed to react to a predetermined voltage threshold to control the input common mode variation. One skilled in the art will appreciate that different implementations of ICMFBC 518 are possible. Comparator 518 may, for example, be implemented as a clock comparator.

Figure 6:
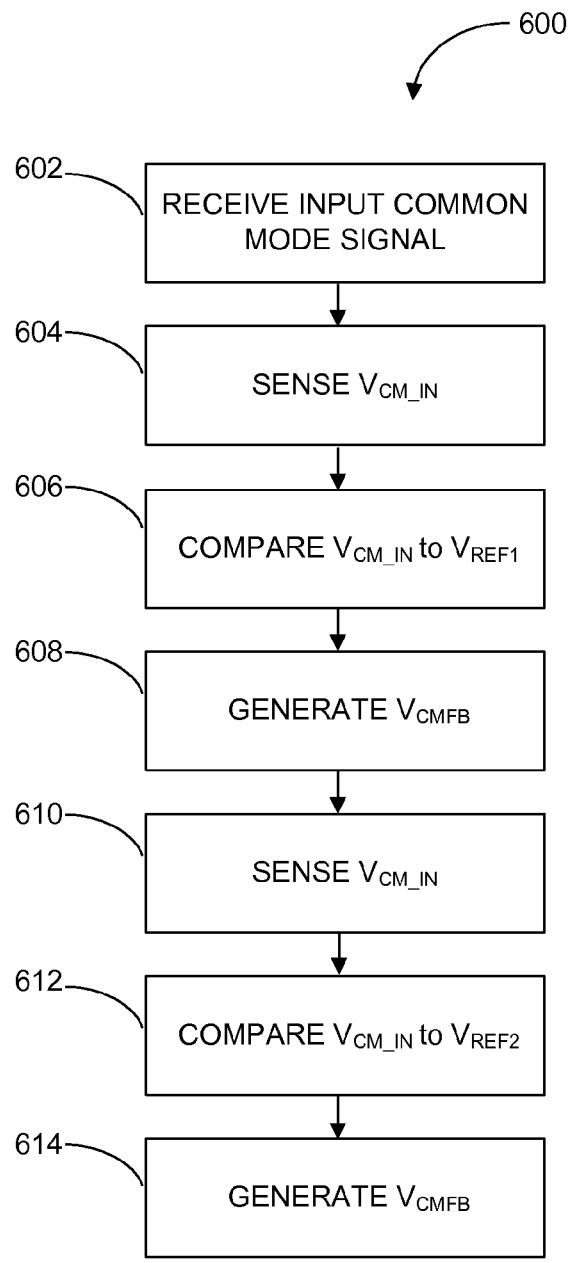
FIG. 6 is a flowchart of an illustrative process for noise cancellation in accordance with various embodiments of the invention.

FIG. 6 is a flowchart of an illustrative process to control an input common mode voltage in accordance with various embodiments of the invention. The process for controlling an input common mode signal starts at step 602 when a differential amplifier receives an input common mode signal at a differential input, for example, from the output of a sensor circuit. In one embodiment, the differential amplifier is a fully differential amplifier.

At step 604, an input common mode comparator senses the input common mode voltage at the differential input of the differential amplifier.

At step 606, the input common mode comparator compares the input common mode voltage to a first common mode reference voltage to determine whether the difference exceeds a predetermined threshold value.

At step 608, the input common mode comparator generates a correction signal by injecting a feed-forward current into a differential feed-forward current path to adjust the input common mode voltage.

At step 610, an input common mode amplifier senses the input common mode signal at the input of the differential amplifier.

At step 612, the input common mode amplifier compares the input common mode voltage to a second common mode reference voltage to determine a residual difference value.

Finally, at step 614, input common mode amplifier generates a common mode feedback signal to adjust the input common mode voltage via a feedback capacitor coupled in a feedback loop to force the input common mode voltage to approach the second common mode reference voltage.

It will be appreciated by those skilled in the art that fewer or additional steps may be incorporated with the steps illustrated herein without departing from the scope of the invention. No particular order is implied by the arrangement of blocks within the flowchart or the description herein.

It will be appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. A comparator-based common mode voltage control circuit comprising:
   a differential amplifier comprising a differential amplifier input to receive a differential input signal that carries an input common mode voltage;
   an input common mode feedback comparator comprising a first reference signal input to receive a first reference signal, the feedback comparator compares the differential input signal to the first reference signal to generate a comparison result that indicates when the input common mode voltage exceeds a predetermined threshold value with respect to the first reference signal; and
   a correction signal that is applied to the differential amplifier input to control the input common mode voltage based on the comparison result.

2. The control circuit according to claim 1, wherein the comparator is a dedicated rail-to-rail comparator capable of utilizing substantially an entire output range of a power supply.

3. The control circuit according to claim 1, wherein the feedback comparator applies the correction signal to the input of the differential amplifier when the input common mode voltage exceeds a predetermined threshold voltage.

4. The control circuit according to claim 1, further comprising a first set of feedback capacitors coupled between an output of the feedback comparator and the differential amplifier input.

5. The control circuit according to claim 4, wherein the first set of feedback capacitors share a common terminal, the common terminal being coupled to the output of the feedback comparator.

6. The control circuit according to claim 4, wherein the feedback comparator delivers the correction signal via the first set of feedback capacitors to the input of the differential amplifier to compensate for an input common mode voltage variation.

7. The control circuit according to claim 6, wherein the correction signal comprises a feed forward charge to adjust the input common mode voltage.

8. The control circuit according to claim 1, further comprising a feedback amplifier coupled to the differential amplifier input to sense the input common mode voltage, the feedback amplifier comprises a second reference voltage input to receive a second reference voltage to determine a difference value between the second reference voltage and the input common mode voltage and, based on the difference value, the feedback amplifier generates a common mode feedback signal that is applied to the differential amplifier input to force the input common mode voltage to approach the second reference voltage.

9. The control circuit according to claim 8, further comprising a second set of feedback capacitors coupled between an output of the feedback amplifier and the differential amplifier input.

10. The control circuit according to claim 9, wherein the second set of feedback capacitors share a common terminal, the common terminal being coupled to the output of the feedback amplifier.

11. The control circuit according to claim 10, wherein the feedback comparator is a full swing comparator that serves as a feed-forward current path for the feedback amplifier.

12. A differential detection circuit comprising:
   a sensor to generate a differential sensor output signal, the differential sensor output signal comprises an input common mode voltage;
   a differential amplifier comprising first and second amplifier inputs coupled to receive the differential sensor output signal, the differential amplifier generates an output voltage representative of the differential sensor output signal; and
   a feedback comparator coupled in a loop configuration, the feedback comparator receives the input common mode voltage, compares the differential input signal to determine when the input common mode voltage exceeds a predetermined threshold value with respect to a reference signal, and generates a correction signal comparison result that is used as a correction signal, the correction signal is applied to first and second amplifier inputs to control the input common mode voltage.

13. The differential detection circuit according to claim 12, further comprising a feedback amplifier coupled in a first loop between the sensor and the differential amplifier, the feedback amplifier generates a common mode feedback signal that is applied to the first and second amplifier inputs to dynamically control the input common mode voltage.

14. The differential detection circuit according to claim 12, wherein the sensor is a differential capacitive sensor, the differential capacitive sensor comprises an input coupled to first and second sensing capacitors, the first and second sensing capacitors generate the differential sensor output signal.

15. The differential detection circuit according to claim 12, wherein the feedback comparator delivers the correction signal via a set of feedback capacitors to the input of the differential amplifier to compensate for an input common mode voltage variation.

16. The differential detection circuit according to claim 12, wherein the correction signal comprises a feed forward charge.

17. A method to control an input common mode signal, the method comprising:
   receiving an input common mode signal at an amplifier input;
   sensing an input common mode voltage at the amplifier input with a feedback comparator;
   comparing the input common mode voltage to a first reference signal to determine whether the difference exceeds a predetermined threshold value;
   generating a correction signal to adjust the input common mode voltage;
   sensing the input common mode signal at the input of the amplifier with a feedback amplifier;
   comparing the input common mode voltage to a second reference signal to determine a residual difference value; and
   generating via a feedback capacitor a common mode feedback signal that adjusts the input common mode voltage by forcing the input common mode voltage to approach the second common mode reference signal.

18. The method according to claim 17, wherein the generating the correction signal comprises injecting a feed-forward current into a differential feed-forward current path to adjust the input common mode voltage.

19. The method according to claim 17, wherein the receiving the input common mode signal occurs at a differential input of a differential amplifier.

20. The method according to claim 17, wherein the input common mode voltage is associated with an output of a sensor circuit.

* * * * *